(12) United States Patent
Noh

(10) Patent No.: US 8,923,046 B2
(45) Date of Patent: Dec. 30, 2014

(54) SEMICONDUCTOR MEMORY DEVICE AND METHOD OF OPERATING THE SAME

(75) Inventor: Yoo Hyun Noh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 170 days.

(21) Appl. No.: 13/601,374

(22) Filed: Aug. 31, 2012

(65) Prior Publication Data

US 2013/0163324 A1    Jun. 27, 2013

(30) Foreign Application Priority Data

Dec. 22, 2011   (KR) .................. 10-2011-0139984

(51) Int. Cl.
  *G11C 11/34*   (2006.01)
(52) U.S. Cl.
  USPC ............ 365/185.03; 365/185.11; 365/185.12; 365/185.17; 365/185.18; 365/185.19; 365/185.22; 365/185.24; 365/185.29; 365/185.33
(58) Field of Classification Search
  USPC ............ 365/185.03, 185.11, 185.12, 185.17, 365/185.18, 185.19, 185.22, 185.24, 365/185.29, 185.33
  See application file for complete search history.

(56) References Cited

U.S. PATENT DOCUMENTS

| | | | | |
|---|---|---|---|---|
| 7,830,717 B2 * | 11/2010 | Won et al. | ................ | 365/185.17 |
| 8,355,286 B2 * | 1/2013 | Choi et al. | ................ | 365/185.22 |
| 8,422,305 B2 * | 4/2013 | Lee | ......................... | 365/185.22 |
| 8,508,992 B2 * | 8/2013 | Park | ........................ | 365/185.03 |
| 8,537,612 B2 * | 9/2013 | Kang | ....................... | 365/185.03 |
| 8,582,371 B2 * | 11/2013 | Ahn | ......................... | 365/185.24 |
| 8,625,354 B2 * | 1/2014 | Cho et al. | ................. | 365/185.22 |

* cited by examiner

*Primary Examiner* — Trong Phan
(74) *Attorney, Agent, or Firm* — IP & T Group LLP

(57) ABSTRACT

A semiconductor memory device includes a memory cell array including first memory cells and second memory cells connected to at least one word line, a circuit group configured to perform a pre-program operation on the first memory cells using a target voltage and a main program operation on the first memory cells and the second memory cells using a final target voltage, and a control circuit configured to set the target voltage depending on variations in threshold voltages of the first memory cells caused by the main program operation of the second memory cells.

17 Claims, 6 Drawing Sheets

SEMICONDUCTOR MEMORY DEVICE AND METHOD OF OPERATING THE SAME

CROSS-REFERENCE TO RELATED APPLICATION

This application claims priority to Korean Patent Application No. 10-2011-0139984, filed on Dec. 22, 2011, the disclosure of which is incorporated herein by reference in its entirety.

BACKGROUND

The present invention relates to a semiconductor memory device and a method of operating the same. More specifically, the present invention relates to a method of programming a semiconductor memory device.

A semiconductor memory device may include a memory cell array in which data is stored, and the memory cell array may include a plurality of memory cell blocks. Each of the memory cell blocks may include a plurality of cell strings, and each of the cell strings may include a plurality of memory cells.

A program operation of a semiconductor memory device may be performed by selecting one memory cell block out of the plurality of memory cell blocks and on each of pages included in the selected memory cell block. The program operation will be described hereinafter in detail with reference to the accompanying drawings.

FIG. 1 is a circuit diagram of a memory cell block, illustrating a conventional program method.

Referring to FIG. 1, the memory cell block includes a plurality of cell strings STe and STo. The cell strings may be referred to as even strings STe or odd strings STo depending on the order of disposition thereof. Even bit lines BLe are connected to the even strings STe, while odd bit lines BLo are connected to the odd strings STo.

As the integration density of semiconductor memory devices increases, a distance between the even and odd cell strings STe and STo decreases, and a distance between adjacent memory cells also decreases. As a result, interference between the adjacent memory cells increases.

Therefore, in a program method of performing a program operation on the odd strings STe after performing a program operation on the even strings STe, even cells Fe of the even strings STe are programmed to have threshold voltages which are determined to be lower than a target voltage in consideration of interference caused in the even cells Fe during a program of odd cells Fo included in the odd strings STo. Thereafter, the odd strings STo are programmed until threshold voltages of the odd cells Fo reach a target voltage, and then the even strings STe are programmed until threshold voltages of the even cells Fe of the even strings STe reach a target voltage. The above-described program operation is referred to as a pre-program. However, even if the pre-program is applied, interference still occurs due to structural characteristics of adjacent cells and a memory device, which will be described in detail hereinafter.

FIG. 2 is a graph illustrating features of a conventional program method.

Referring to FIG. 2, in a multi-level cell (MLC) programmed in a plurality of program states, a method of programming even cells (refer to Fe of FIG. 1) of a selected page in a first state MPV1 will be exemplarily described.

A pre-program operation may be performed until threshold voltages of the even cells Fe reach a pre-target voltage Vpre lower than a target voltage of the first state MPV1. When all the threshold voltages of the even cells Fe reach the pre-target voltage Vpre (refer to 21), the odd cells (refer to Fo of FIG. 1) may be programmed such that threshold voltages of odd cells Fo reach a target voltage. During a program operation of the odd cells Fo, the threshold voltages of the pre-programmed even cells Fe may increase due to interference (refer to 22). Thereafter, before the threshold voltages 22 of the pre-programmed even cells Fe are finally programmed, it may be determined in which state the pre-programmed even cells Fe are to be programmed by reading data of the pre-programmed even cells Fe. That is, when the threshold voltages of the pre-programmed even cells Fe are lower than a read reference voltage Vtr, the even cells Fe may be programmed to be in the first state MPV1 during a main program operation. When the threshold voltages of the pre-programmed even cells Fe are higher than the read reference voltage Vtr, the even cells Fe may be programmed to be in a second state MPV2 higher than the first state MPV1 during the main program operation.

If the threshold voltages of some of the even cells Fe to be programmed to be in the first state MPV1 excessively increase due to interference and become higher than the reference voltage Vtr (refer to 23), the corresponding memory cells would be programmed to be not in the first state MPV1 but in the second state MPV2 during a main program operation (refer to 24). Accordingly, after the program operation is finished, since data of the corresponding cells is read as the second state MPV2 based on a read voltage Vread, the reliability of the program operation may be degraded. This phenomenon mainly occurs due to interference caused by programming adjacent cells.

Meanwhile, the amount of interference between adjacent cells may vary depending on a structure of a memory device. When a read reference voltage set based on the same interference amount is applied to all semiconductor devices, even if a main program operation is performed after a pre-program operation as described above, reliability may be degraded as described in detail with reference to the following drawings.

FIG. 3 is a cross-sectional view of a conventional memory device.

A cross-section of memory cells included in different cell strings will be described with reference to FIG. 3. A tunnel insulating layer 32 and a floating gate 33 may be stacked on an active region of a semiconductor substrate 31, and an isolation layer 34 may be formed in an isolation region thereof. For example, an upper surface of the isolation layer 34 may be between upper surfaces of the tunnel insulating layer 32 and the floating gate 33. A dielectric layer 35 may be formed along the surfaces of the floating gate 33 and the isolation layer 34, and a control gate 36 serving as a word line may be formed on the dielectric layer 35. Here, each of active regions may become a region in which a cell string is formed.

In particular, an effective height EFH between the upper surface of the isolation layer 34 and a lower surface of the floating gate 33 may greatly affect interference between adjacent cells. For instance, capacitance between the floating gates 33 may vary depending on the effective height EFH, and a depletion region may occur in the control gate 36 due to a program voltage applied to the control gate 36 and voltages applied to channel regions of unselected cell strings and selected cell strings, respectively, during a program operation.

As a result, even if a program operation is performed using the same program voltage, the same program prohibition voltage, and the same program permission voltage, the amount of interference may vary depending on the kind of a semiconductor memory device, thereby degrading the reliability of the program operation.

SUMMARY OF THE INVENTION

The present invention is directed to a semiconductor memory device and a method of operating the same, which differently set a read reference voltage used for a pre-program operation depending on the test result of the semiconductor memory device to improve the reliability of the program operation thereof.

One aspect of the present invention provides a semiconductor memory device including: a memory cell array including first memory cells and second memory cells connected to at least one word line, a circuit group configured to perform a pre-program operation on the first memory cells using a target voltage and a main program operation on the first memory cells and the second memory cells using a final target voltage, and a control circuit configured to set the target voltage depending on variations in threshold voltages of the first memory cells caused by the main program operation of the second memory cells.

Another aspect of the present invention provides a method of operating a semiconductor memory device, including: performing a first test program operation on first memory cells connected to a selected word line to measure first threshold voltages of the first memory cells, performing a second test program operation on second memory cells connected to the selected word line to measure second threshold voltages of the first memory cells, setting a target voltage using a difference between the first and second threshold voltages, and performing a program operation using the target voltage.

BRIEF DESCRIPTION OF THE DRAWINGS

The above and other features and advantages of the present invention will become more apparent to those of ordinary skill in the art by describing in detail exemplary embodiments thereof with reference to the accompanying drawings in which.

DETAILED DESCRIPTION OF EMBODIMENTS

The present invention will be described more fully hereinafter with reference to the accompanying drawings, in which exemplary embodiments of the present invention are shown. The present invention may, however, be embodied in different forms and not be limited to the embodiments set forth herein. Rather, these exemplary embodiments are provided to fully convey the scope of the present invention to one skilled in the art.

Figure 1:
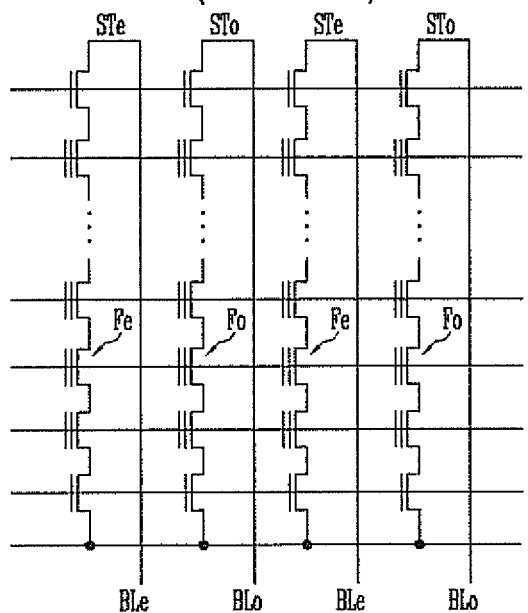
FIG. 1 is a circuit diagram of a memory cell block, illustrating a conventional program method.
Figure 2:
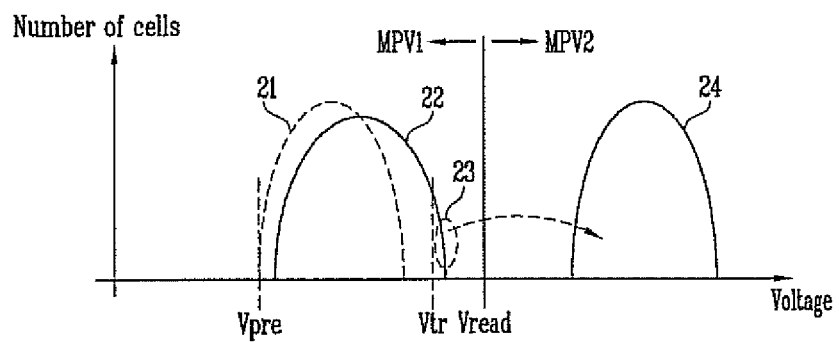
FIG. 2 is a graph illustrating features of a conventional program method.
Figure 3:
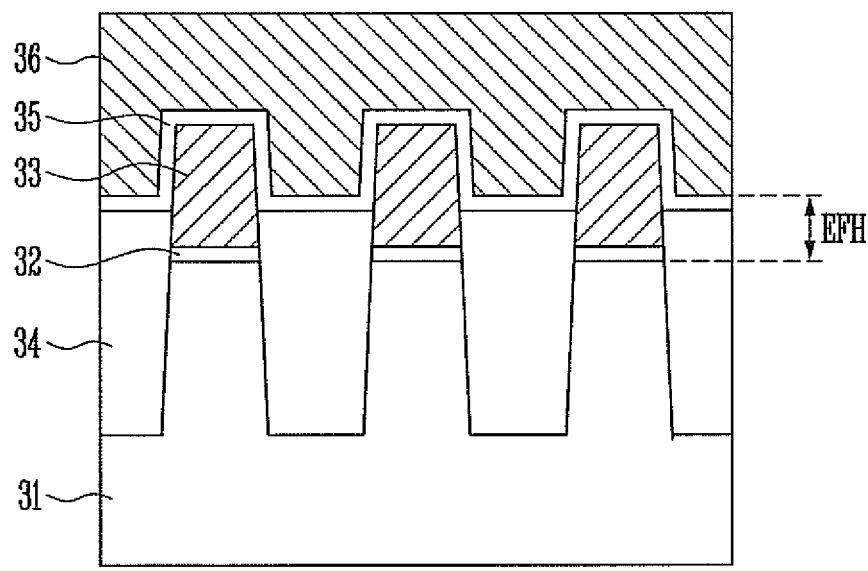
FIG. 3 is a cross-sectional view of a conventional memory device.
Figure 4:
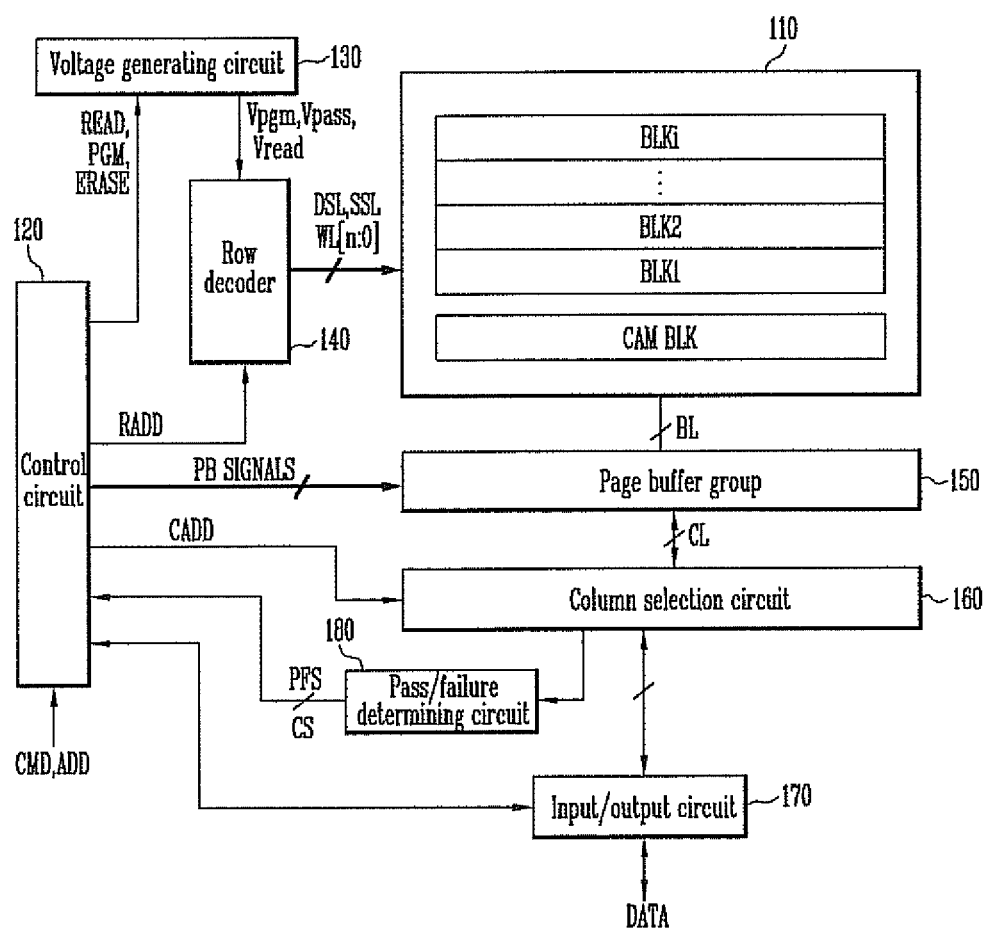
FIG. 4 is a block diagram of a semiconductor memory device according to an exemplary embodiment of the present invention.

FIG. 4 is a block diagram of a semiconductor memory device according to an exemplary embodiment of the present invention.

Referring to FIG. 4, the semiconductor memory device may include a memory cell array 110, a circuit group 130, 140, 150, 160, 170, and 180 configured to perform a program operation, a read operation, or an erase operation of memory cells included in the memory cell array 110, and a control circuit 120 configured to control the circuit groups 130, 140, 150, 160, 170, and 180 to set threshold voltages of selected memory cells depending on input data.

In a NAND flash memory device, the circuit group 130, 140, 150, 160, 170, and 180 may include a voltage generating circuit 130, a row decoder 140, a page buffer group 150, a column selection circuit 160, an input/output (I/O) circuit 170, and a pass/failure determining circuit 180.

The memory cell array 110 may include a plurality of memory cell blocks BLK1 to BLKi in which data is stored, and a cam block CAM BLK in which various set values used for operations are stored. In particular, in a semiconductor memory device (or memory chip), the cam block CAM BLK may store data regarding interference between adjacent memory cells. The data regarding the interference may be generated based on a test result of memory cells connected to any word line selected from a memory cell block. A specific method of generating the data regarding the interference will be described later with reference to 'FIG. 6.'

Each of the memory cell blocks BLK1 to BLKi and the cam block CAM BLK may have the same configuration. The cam block CAM BLK may include one block or a plurality of blocks.

The control circuit 120 may internally output a program operation signal PGM, a read operation signal READ, or an erase operation signal ERASE in response to a command signal CMD. The control circuit 120 may output page buffer signals PB SIGNALS for controlling page buffers included in the page buffer group 160 depending on the kind of an operation. Also, the control circuit 120 may internally output a row address signal RADD and a column address signal CADD in response to an address signal ADD. Furthermore, the control circuit 120 may confirm whether threshold voltages of selected memory cells have risen or dropped to a target voltage in response to a pass/failure signal PFS output by the pass/failure determining circuit 180 during a program or erase verification operation, and determine whether the program or erase operation is to be re-performed, has finished, or has failed based on the confirmation result.

In particular, before performing a main program operation using a target voltage, the control circuit 120 may control the circuit groups 130, 140, 150, 160, 170, and 180 during a program operation of memory cells connected to a selected word line to perform a pre-program operation using a pre-target voltage determined based on the data regarding the interference between adjacent cells.

The voltage generating circuit 130 may output a program voltage Vpgm, a pass voltage Vpass, or a read voltage Vread used for programming, reading, or erasing memory cells to global lines in response to operation signals PGM, READ, and ERASE, which are internal command signals of the control circuit 120. In particular, the voltage generating circuit 130 may generate various verification voltages under the control of the control circuit 120 during a verification operation of the program operation.

The row decoder 140 may transmit operating voltages generated by the voltage generating circuit 130 to lines DSL, SSL, and WL[n:0] of a selected memory cell block in response to the row address signals RADD of the control circuit 120.

The page buffer group 150 may include a plurality of page buffers configured to operate in response to the page buffer signals PB SIGNALS output by the control circuit 120. Each of the page buffers may include a plurality of latches and may apply a program permission voltage or a program prohibition voltage to selected bit lines BL or unselected bit lines BL depending on program data stored in each of the latches during the program operation. For example, the program permission voltage may be set to a ground voltage (0 V), and the program prohibition voltage may be set to a power supply voltage Vcc.

The column selection circuit 160 may select the page buffers included in the page buffer group 150 in response to the column address signal CADD outputted by the control circuit 120. Data latched in the page buffer selected by the column selection circuit 160 may be output. Also, the column selection circuit 160 may receive data output by the page buffer group 150 through a column line CL and transmit the data to the pass/failure determining circuit 180.

To respectively transmit externally input program data DATA to the page buffers of the page buffer group 150 during the program operation, the I/O circuit 170 may transmit the program data DATA to the column selection circuit 160 under the control of the control circuit 120. When the program data DATA is sequentially transmitted to the respective page buffers of the page buffer group 150 by the column selection circuit 160, each of the page buffers may store the input program data DATA in an internal latch. During a read operation, the I/O circuit 170 may externally output the data DATA transmitted from the page buffers of the page buffer group 150 through the column selection circuit 160.

The pass/failure determining circuit 180 may not only transmit address information CS regarding memory cells to the control circuit 120 during the program operation, but also transmit the pass/failure signal PFS to the control circuit 120 based on a verification result of the program operation.

Figure 5:
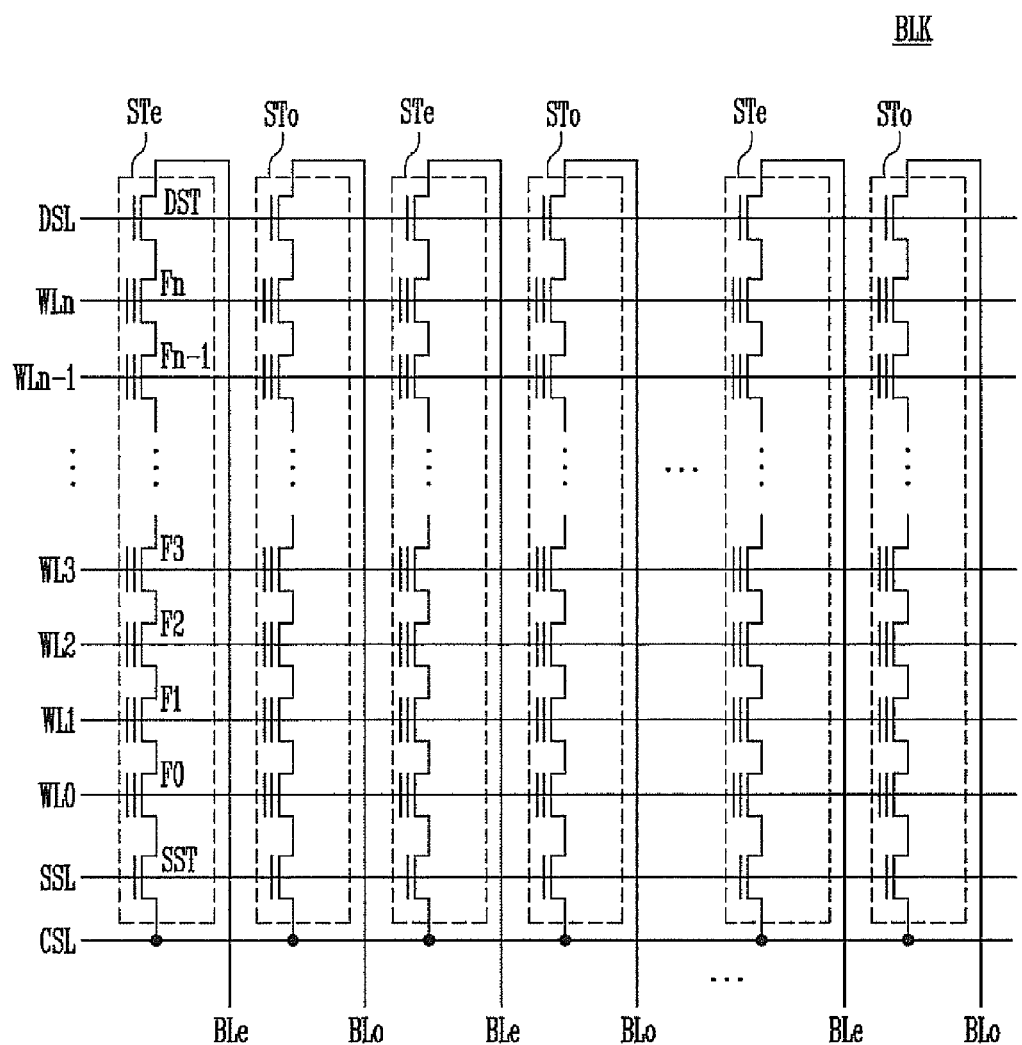
FIG. 5 is a detailed circuit diagram of a memory cell block of FIG. 4.

FIG. 5 is a specific circuit diagram of the memory cell block of FIG. 4.

Referring to FIG. 5, the memory cell block may include a plurality of cell strings STe and STo connected between bit lines BLe and BLo and a common source line CSL. The cell strings STe and STo may be categorized as either even strings STe or odd strings STo depending on the order of disposition thereof. The even and odd strings STe and STo may have the same configuration. An example of the even strings STe will be described in detail.

The even string STe may include a source selection transistor SST, a plurality of memory cells F0 to Fn, and a drain selection transistor DST, which may be connected in series to one another. Gates of drain selection transistors DST included in different cell strings STe and STo may be connected to a drain selection line DSL, gates of the memory cells F0 to Fn may be connected to respective word lines WL0 to WLn, and gates of the corresponding memory cells in different cell strings STe and STo, for example, the gates of the memory cells Fn may be connected to the word line WLn. The gates of source selection transistors SST in different cell strings STe to STo may be connected to a source selection line SSL. The source selection transistors SST may be connected to the common source line CSL, and the drain selection transistors DST may be connected to the bit lines BLe or BLo. Here, a group of memory cells connected to the same word line is referred to as a page.

A program operation may be performed on each of pages. To compensate for a variation in threshold voltage due to interference between adjacent memory cells, after performing a pre-program operation using a pre-target voltage lower than a target voltage, a main program operation may be performed using the target voltage. For instance, when a program operation is performed on each of even memory cells and odd memory cells, threshold voltages of the even memory cells may vary depending on the program operation of the odd memory cells. Thus, the program operation of the odd memory cells may be performed, after a pre-program operation is performed on even memory cells. After the program operation of the odd memory cells is finished, a main program operation may be performed on the even memory cells to complete the program operation of the even memory cells.

In particular, the pre-program operation may be performed using a pre-target voltage lower than a final target voltage. Here, the pre-target voltage may be set in consideration of interference of each of semiconductor memory devices. A method of setting the pre-target voltage will be described with reference to FIGS. 6 and 7.

Figure 6:
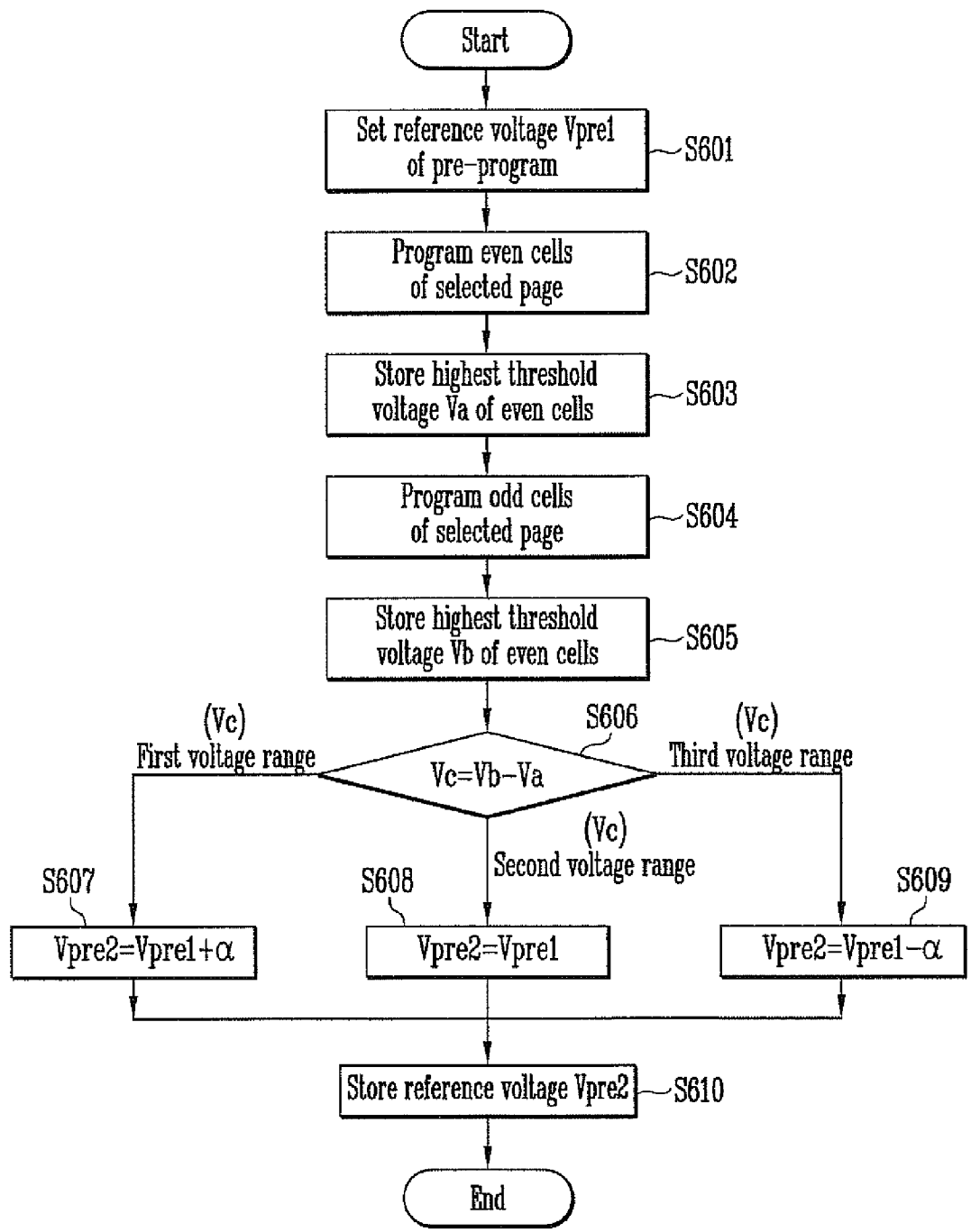
FIG. 6 is a flowchart illustrating a method of setting a reference voltage used for a pre-program operation according to an exemplary embodiment of the present invention.
Figure 7:
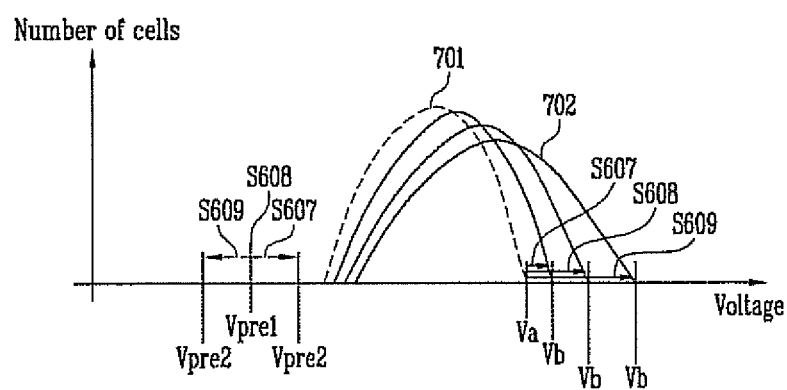
FIG. 7 is a graph illustrating a method of setting the reference voltage of FIG. 6.

FIG. 6 is a flowchart illustrating a method of setting a reference voltage used for a pre-program operation according to an exemplary embodiment of the present invention, and FIG. 7 is a graph illustrating a method of setting the reference voltage of FIG. 6.

Referring to FIGS. 6 and 7, a pre-target voltage may be set in each of semiconductor memory devices using the following method.

Step of Setting First Pre-Target Voltage (Vpre1) (S601)

A first pre-target voltage Vpre1 may be set to a voltage lower than target voltages of memory cells. For example, the amount of interference caused by program operations of adjacent cells ranges from about 150 mV to about 250 mV, and the first pre-target voltage Vpre1 may be set by considering the amount of interference. In a single-level cell SCL programmed in one program state, since a target voltage is fixed at one value, the first pre-target voltage Vrep1 may also be set to one value. Also, in a multi-level cell MLC programmed in a plurality of program states, since a target voltage is set to a plurality of values depending on the respective program states, the first pre-target voltage Vpre1 may also be set to a plurality of values depending on the respective target voltages. Even in the MLC, each of the first pre-target voltages Vpre1 may be set to a lower value than each of the target voltages.

Step of Programming First Memory Cells (S602)

Since a plurality of memory cell blocks are included in a memory cell array of a semiconductor memory device, one memory cell block may be selected out of the plurality of memory cell blocks. A test program operation may be performed on first memory cells out of memory cells connected to any one word line of the selected memory cell block. For example, the memory cells connected to the one word line may be divided into even memory cells and odd memory cells depending on the order of disposition thereof. When the even memory cells are programmed earlier than the odd memory cells, the even memory cells may be referred to as the first memory cells.

In particular, although a test program operation of the even memory cell may be performed using an incremental step pulse program (ISPP) method, since the test program operation is not a program operation performed to elevate a threshold voltage of memory cells to a target voltage, a verification operation may be omitted to shorten an operation time. For example, a program voltage elevated every time may be applied to a selected word line five to ten times so that the test program operation may be performed on the even memory cells. For instance, the test program operation may include applying a program voltage to a selected word line five times while elevating the program voltage by 0.3 V each time. Specifically, a program permission voltage (e.g., 0 V) may be applied to first bit lines connected to the first memory cells, a program prohibition voltage (e.g., a power supply voltage) may be applied to second bit lines connected to second memory cells, and a program voltage may be applied to the selected word line, thereby performing the program operation on the first memory cells.

Step of Storing First Threshold Voltage (S603)

A highest threshold voltage of threshold voltages (refer to 701 in FIG. 7) of the first memory cells elevated due to the test program operation of the first memory cells may be measured. The measured threshold voltage may be referred to as a first threshold voltage Va. Thereafter, data corresponding to the first threshold voltage Va may be stored.

Step of Programming Second Memory Cells (S604)

A program operation may be performed on the second memory cells other than the first memory cells, out of the memory cells connected to the selected word line. The program operation of the second memory cells may be performed using the same method as the program operation of the first memory cells. For example, a program permission voltage may be applied to second bit lines connected to the second memory cells, a program prohibition voltage may be applied to first bit lines connected to the first memory cells, and a program voltage may be applied to the selected word line five times while gradually elevating the program voltage by 0.3 V each time.

Step of Storing Second Threshold Voltage (S605)

During the programming of the second memory cells (S604), the program operation of the second memory cells may interfere in the already programmed first memory cells so that threshold voltages of the first memory cells may elevate (refer to 702 in FIG. 7). Thus, a highest threshold voltage of the threshold voltages of the first memory cells may be measured again. The measured threshold voltage may be referred to as a second threshold voltage Vb. Thereafter, data corresponding to the second threshold voltage Vb may be stored.

Step of Calculating Difference in Threshold Voltage (S606)

A difference between the first threshold voltage Va and the second threshold voltage Vb respectively measured in steps S603 and S605 may be obtained. For example, since threshold voltages of the previously programmed memory cells may be elevated due to interference, the difference may be obtained by subtracting the first threshold voltage Va from the second threshold voltage Vb. The difference between the second threshold voltage Vb and the first threshold voltage Va may be obtained by performing a logic operation on data stored in steps S603 and S605, respectively. Thereafter, to determine the extent of the obtained interference amount Vc, i.e., the difference, it may be determined which one of a plurality of set voltage ranges the interference amount Vc is within. As the number of preset ranges of the interference amount Vc increases, a program operation may be controlled more precisely. For example, it may be determined whether the interference amount Vc is within a first voltage range, a second voltage range higher than the first voltage range, or a third voltage range higher than the second voltage range. Here, the first voltage range may correspond to a range lower than the average interference range of a semiconductor memory device, the second voltage range may correspond to the average interference range of the semiconductor memory device, and the third voltage range may correspond to a range higher than the average interference range of the semiconductor memory device. For instance, a period in which the interference amount Vc is about 150 mV or less may be set as the first voltage range, a period in which the interference amount Vc is about 150 mV to about 250 mV may be set as the second voltage range, and a period in which the interference range Vc is about 250 mV or more may be set as the third voltage range.

Step of Setting Second Pre-Target Voltage (Vpre2) (S607, S608, S609)

When the difference between the first and second threshold voltages Va and Vb obtained in step S606 is within the first voltage range, the first pre-target voltage Vpre1 may be elevated by a given level a to be set as a second pre-target voltage Vpre2 (step S607). Here, the first voltage range may correspond to a range lower than the average interference range of semiconductor memory devices, and the given level a may be the difference between the first and second threshold voltages Va and Vb. For example, a voltage obtained by elevating the first pre-target voltage Vpre1 by about 80 mV may be set as the second pre-target voltage Vpre2. Referring to FIG. 7, when the interference amount Vc is within a range lower than the average interference range, since the elevated amounts of threshold voltages of the test-programmed even memory cells due to the interference are small, the second pre-target voltage Vpre2 may be elevated (step S607).

When the difference between the first and second threshold voltages Va and Vb obtained in step S606 is within the second voltage range, the same voltage as the first pre-target voltage Vpre1 may be set as the second pre-target voltage Vpre2 (step S608). Here, the second voltage range may correspond to the average interference range of the semiconductor memory devices. Referring to FIG. 7, when the interference amount Vc is within the average interference range, since the elevated amounts of the threshold voltages of the test-programmed even memory cells due to the interference are similar to those under the average interference in which the first pre-target voltage Vpre1 is set, the second pre-target voltage Vpre2 may be set to the same level as the first pre-target voltage Vpre1 (step S608).

When the difference between the first and second threshold voltages Va and Vb obtained in step S606 is within the third voltage range higher than the second voltage range, the first pre-target voltage Vpre1 may be lowered by a given level a to be set as the second pre-target voltage Vpre2 (step S609). Here, the third voltage range may correspond to a range higher than the average interference range of the semiconductor memory device, and the given level a may be the difference between the first and second threshold voltages Va and Vb. For instance, a voltage obtained by lowering the first pre-target voltage Vpre1 by about 80 mV may be set as the second pre-target voltage Vpre2. Referring to FIG. 7, when the interference amount Vc is within a range higher than the average interference range, since the elevated amounts of threshold voltages of the test-programmed even memory cells due to the interference are large, the second pre-target voltage Vpre2 may be lowered (step S609).

As described above, the first pre-target voltage Vpre1 of all semiconductor memory devices may be set based on a specific interference amount in advance, a test program operation may be performed on any page of each of the semiconductor memory devices, and the second pre-target voltage Vpre2 of each of the semiconductor devices may be set in response to the varied threshold voltage.

Step of Storing Second Threshold Voltage (S610)

Data corresponding to the second pre-target voltage Vpre2 set in steps S607, S608, and S609 may be stored.

Afterwards, when a main program operation is performed, a pre-program operation and a main program operation may be performed using the stored second pre-target voltage Vpre2.

Figure 8:
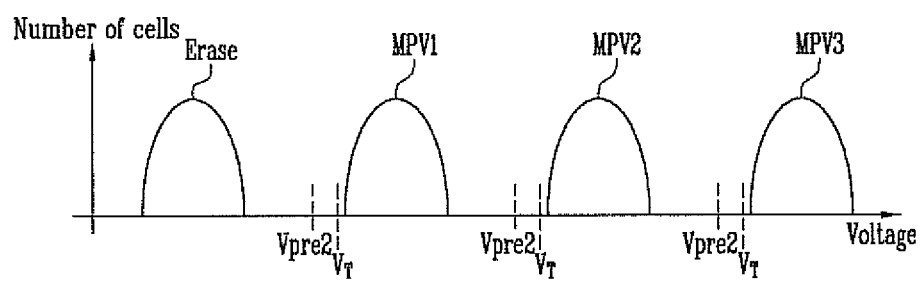
FIG. 8 is a graph illustrating a program method according to an exemplary embodiment of the present invention.

FIG. 8 is a graph illustrating a program method according to an exemplary embodiment of the present invention.

A method of programming odd memory cells after programming even memory cells will be described with reference to FIG. 8.

After an erase operation is performed on a selected memory cell block, a pre-program operation may be performed on the even memory cells. The pre-program operation may be performed such that each of threshold voltages of the even memory cells reaches a pre-target voltage lower than a final target voltage $V_T$, because the program operation of the odd memory cells interferes in the threshold voltages of the even memory cells to vary. Specifically, the pre-program operation of the even memory cells may be performed until each of the threshold voltages of the even memory cells becomes higher than the second pre-target voltage Vpre2. As described in detail with reference to FIG. 6, the second pre-target voltage Vpre2 of each of the semiconductor memory devices may be set. Thereafter, the program operation may be performed until each of the threshold voltages of the odd memory cells becomes higher than a target voltage.

Thereafter, the even memory cells may be programmed until each of the threshold voltages of the even memory cells reaches the final target voltage. It may be determined based on a read result of each of the pre-programmed even memory cells which states the pre-programmed memory cells are programmed in. That is, since each of the threshold voltages of the pre-programmed even memory cells increases with a pre-target voltage, which is lower than but approximates the final target voltage, the ranges of threshold voltages may be divided depending on a desired program state. That is, pre-programmed even memory cells may be read, and the even memory cells may be finally programmed to be in a first state, when each of the threshold voltages of the even memory cells is lower than a read reference voltage Vtr, and a second state higher than the first state, when each of the threshold voltages of the even memory cells is higher than the read reference voltage Vtr. It will be described hereinafter in detail with respect to a program operation of a multi-level cell MLC.

Therefore, a final program operation of the even memory cells may be determined by the pre-program operation. Since the second pre-target voltage Vpre2 on which the threshold voltage is programmed based during the pre-program operation is determined based on the test result of the corresponding semiconductor memory device, the reliability of the program operation may be improved.

Another exemplary embodiment of a program operation of a multi-level cell MLC will be described with reference to FIG. 8.

As described above, a test program operation may be performed on memory cells connected to a selected word line to set a second pre-target voltage Vpre2 of a semiconductor memory device. The second pre-target voltage Vpre2 set to each of semiconductor memory devices may be used during a pre-program operation of a program operation of the corresponding semiconductor memory device. More specifically, the pre-program operation may be performed on even memory cells before performing a most significant bit (MSB) program operation on odd memory cells.

Specifically, after performing an erase operation on a memory cell block to be programmed, a main least-significant-bit (LSB) program operation may be performed on the even memory cells, and then a pre-program operation may be performed on MSB target cells. Specifically, the pre-program operation may be performed on the MSB target cells, out of the even memory cells, using the second pre-target voltage Vpre2 set as described in detail with reference to FIG. 6. The pre-program operation may be performed until all threshold voltages of selected memory cells become higher than the second pre-target voltage Vpre2. Thereafter, a main LSB program operation may be performed on the odd memory cells, and then an MSB program operation may be performed. That is, the odd memory cells may be programmed such that all threshold voltages of the odd memory cells become higher than the target voltage.

When the program operation of the odd memory cells is finished, a main MSB program operation may be performed on the even memory cells. It may be determined based on a read result of the pre-programmed even memory cells which states the even memory cells are to be programmed in. That is, when the pre-programmed memory cells are read, cells decided as being in a first state MPV1 may be programmed be in the first state MPV1 during a main MSB program operation, cells decided as being in a second state MPV2 may be programmed to be the second state MPV2 during the main MSB program operation, and cells decided as being in a third state MPV3 may be programmed to be in the third state MPV3 during the main MSB program operation. That is, since the second pre-target voltage Vpre2 may be set to a voltage appropriate for each of semiconductor devices, the reliability of the pre-program operation of the even memory cells may be improved. As a result, the reliability of the main MSB program operation of the even memory cells, which is the final program step, may be improved.

According to the present invention, a reference voltage appropriate for each of semiconductor memory devices may be set to improve the reliability of a program operation.

In the drawings and specification, there have been disclosed exemplary embodiments of the present invention, which are exemplary only. Therefore, it will be apparent to those of ordinary skill in the art that various changes and modifications in form and details may be made therein without departing from the spirit and scope of the present invention as defined by the following claims.

What is claimed is:
1. A semiconductor memory device comprising:
   a memory cell array including first memory cells and second memory cells connected to at least one word line;
   a circuit group configured to perform a pre-program operation on the first memory cells using a target voltage and a main program operation on the first memory cells and the second memory cells using a final target voltage; and
   a control circuit configured to set the target voltage depending on variations in threshold voltages of the first memory cells caused by the main program operation of the second memory cells.

2. The device of claim 1, wherein the control circuit is configured to control the circuit group to perform the pre-program operation to increase the threshold voltages of the first memory cells higher than the set target voltage and perform the main program operation to increase the threshold voltages of the first memory cells higher than the final target voltage after increasing threshold voltages of the second memory cells higher than the final target voltage.

3. The device of claim 1, wherein the control circuit is configured to control the circuit group to perform a first test program operation on the first memory cells and perform a second test program operation on the second memory cells, using a test target voltage.

4. The device of claim 3, wherein the control circuit is configured to control the circuit group to perform the first and second test program operations by using an incremental step pulse program (ISPP) method or by applying a program voltage to the word line set times without a verification operation therebetween while increasing the program voltage in each time.

5. The device of claim 3, wherein the control circuit is configured to set the target voltage depending on a difference between the threshold voltages of the first memory cells respectively measured before and after the second test program operation.

6. The device of claim 5, wherein the target voltage is set depending on a difference between highest threshold voltages of the first memory cells respectively measured before and after the second test program operation.

7. The device of claim 5, wherein the control circuit is configured to set the target voltage by elevating the test target voltage when the difference between the threshold voltages is below a reference voltage range, maintaining the test target voltage when the difference between the threshold voltages is within the reference voltage range, and lowering the test target voltage when the difference between the threshold voltages is above the reference voltage range.

8. The device of claim 7, wherein the test target voltage is elevated or lowered by the difference between the threshold voltages.

9. The device of claim 7, wherein the reference voltage range corresponds to the average interference range of semiconductor memory devices.

10. The device of claim 1, wherein the circuit group comprises:
    a voltage generating circuit configured to generate operating voltages for a program operation, a read operation, or an erase operation in response to internal command signals of the control circuit and output the operating voltages to global lines;
    a row decoder configured to transmit the operating voltages from the global lines to local lines of a selected memory cell block of the memory cell array in response to internal addresses of the control circuit;
    a page buffer group configured to detect a program state or erase state of the first and second memory cells, precharge or discharge bit lines connected to the first and second memory cells during the pre-program operation and the main program operation, and latch data corresponding to threshold voltages of the first and second memory cells depending on variations in voltages of the bit lines;
    a column selection circuit configured to select a plurality of page buffers included in the page buffer group in response to the internal addresses of the control circuit; and
    an input/output (I/O) circuit configured to transmit externally input data to the column selection circuit and externally output data transmitted from the column selection circuit.

11. A method of operating a semiconductor memory device, comprising:
    performing a first test program operation on first memory cells connected to a selected word line to measure first threshold voltages of the first memory cells;
    performing a second test program operation on second memory cells connected to the selected word line to measure second threshold voltages of the first memory cells;
    setting a target voltage using a difference between the first and second threshold voltages; and
    performing a program operation using the target voltage.

12. The method of claim 11, wherein the first and second test program operations are performed by using an incremental step pulse program (ISPP) method or by applying a program voltage to the selected word line set times without a verification operation therebetween while increasing the program voltage in each time.

13. The method of claim 11, wherein the setting of the target voltage comprises:
    elevating the target voltage when the difference between the first and second threshold voltages is below a reference voltage range;
    maintaining the target voltage when the difference between the first and second threshold voltages is within the reference voltage range; and
    lowering the target voltage when the difference between the first and second threshold voltages is above the reference voltage range.

14. The method of claim 13, wherein the target voltage is elevated or lowered by the difference between the first and second threshold voltages.

15. The method of claim 13, wherein the reference voltage range corresponds to the average interference range of semiconductor memory devices.

16. The method of claim 11, wherein the performing of the program operation using the target voltage comprises:
    performing a pre-program operation on third memory cells connected to at least one word line using the target voltage to increase threshold voltages of the third memory cells higher than the target voltage.

17. The method of claim 16, wherein the performing of the program operation using the target voltage further comprises:
    performing a main program to increase the threshold voltages of the third memory cells after increasing threshold voltages of fourth memory cells connected to the at least one word line other than the third memory cells.

* * * * *